United States Patent
Roche

(10) Patent No.: US 6,630,719 B2
(45) Date of Patent: Oct. 7, 2003

(54) HARDENED MOS TRANSISTORS

(75) Inventor: Philippe Roche, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/731,266

(22) Filed: Dec. 6, 2000

(65) Prior Publication Data

US 2001/0003369 A1 Jun. 14, 2001

(30) Foreign Application Priority Data

Dec. 9, 1999 (FR) .............................. 99 15564

(51) Int. Cl.⁷ .................... H01L 29/76; H01L 27/108
(52) U.S. Cl. .................. 257/393; 257/298; 257/379
(58) Field of Search ........................ 257/379–385, 257/298, 393, 66, 67, 69, 314

(56) References Cited

U.S. PATENT DOCUMENTS

| | | | |
|---|---|---|---|
| 3,673,428 A | 6/1972 | Athanas | 307/202 |
| 4,933,739 A * | 6/1990 | Harari | 357/55 |
| 4,984,196 A * | 1/1991 | Tran et al. | 365/51 |
| 5,132,771 A | 7/1992 | Yamanaka et al. | 357/59 |
| 5,422,499 A * | 6/1995 | Manning | 257/67 |
| 5,932,914 A * | 8/1999 | Horiguchi | 257/355 |
| 6,187,618 B1 * | 2/2001 | Kao et al. | 438/202 |

FOREIGN PATENT DOCUMENTS

| | | | |
|---|---|---|---|
| FR | A-2 260 869 | 9/1975 | H01L/27/04 |
| JP | 9-55440 | * 2/1997 | H01L/21/8244 |

OTHER PUBLICATIONS

French Search Report from French Patent Application No. 99/15564, filed Dec. 9, 1999.

* cited by examiner

Primary Examiner—Ori Nadav
(74) Attorney, Agent, or Firm—Wolf, Greenfield & Sacks, P.C.; James H. Morris; William R. McClellan

(57) ABSTRACT

A lateral MOS transistor including a gate and drain and source regions of a first conductivity type formed in a substrate of a second conductivity type connected to a first power supply, wherein a doped buried layer of the first conductivity type extends under said drain region and under a portion of the gate, the buried layer being connected to the gate via a one-way connection.

40 Claims, 2 Drawing Sheets

HARDENED MOS TRANSISTORS

FIELD OF THE INVENTION

1. Field of the Invention

The present invention generally relates to insulated gate MOS transistors. More specifically, the present invention relates to the protection—or hardening—of such MOS transistors against ionizing particles.

2. Discussion of the Related Art

Under the effect of ionizing particles, such as for example, heavy ions, protons, alpha particles, it can be observed that MOS transistors, controlled to be off, turn on. This is more particularly observed upon impact of such particles in drain areas, identified as being the most sensitive. This results in untimely switchings that disturb or even damage the devices incorporating these transistors. For example, in SRAM devices, such disturbances are capable of causing the change of the stored logic state to change.

The reduction of transistor dimensions increases the sensitivity of transistors to such impacts.

To overcome the effects of such disturbances, different techniques have been provided. Various non-limiting solutions provided in the specific case of SRAM-type memories will be discussed hereafter.

A first approach consists of providing around the device a shielding, for example made of aluminum, absorbing the particle energy. Such a shielding is bulky and expensive, all the more as it must be thick to be able to absorb the more energetic particles.

A second approach consists of modifying the circuit to enable a cell to return to its initial state after a disturbance. Such modifications consist, for example, of providing additional cells (redundancy), or of modifying the very structure of the elementary six-transistor SRAM cells to guarantee the locking of the stored data. Cells with at least ten transistors or with a resistive decoupling have thus been provided. However, such modifications considerably reduce the cell performance, for example in terms of increasing access time and/or increasing power consumption. Further, they complicate the monolithic implementation of memory devices and/or increase their bulk, which results in a reduced memory density.

A third approach consists of modifying the MOS transistor manufacturing technology. Silicon-on-insulator (SOI) technologies have thus been used. Although the observed performance reductions (increased access time, increased power consumption, increased bulk) are then smaller than with the other techniques already provided, such technologies are particularly complex and expensive to implement.

It has also been provided to make insensitive—to "harden"—the very individual transistors. However, this is performed by oversizing the transistor (increase of the channel area). Such a solution is incompatible with the goal of reducing transistor dimensions. A SRAM formed from such transistors would be slow and have a small density.

SUMMARY OF THE INVENTION

An object of the present invention is to provide a novel structure of MOS transistors with a robust hardening against ionizing particles.

Another object of the present invention is to provide such a structure which induces manufacturing constraints (complexity, cost) that are negligible, or at least much smaller than those induced by present solutions.

Another object of the present invention is to provide a hardened SRAM-type memory cell structure using the transistors according to the present invention.

Another object of the present invention is to provide such a hardened memory structure that has a limited bulk as compared to existing solutions.

Another object of the present invention is to provide such a memory structure that has performances comparable to those of a conventional memory.

To achieve these and other objects, the present invention provides a lateral MOS transistor including a gate and drain and source regions of a first conductivity type formed in a substrate of a second conductivity type connected to a first power supply, wherein a doped buried layer of the first conductivity type extends under said drain region and under a portion of the gate, the buried layer being connected to the gate via a one-way conduction connection.

According to an embodiment of the present invention, the one-way conduction means is a diode, the cathode of which is connected to the transistor gate and the anode of which is connected to the buried layer.

According to an embodiment of the present invention, the connection of the substrate to the first power supply is ensured by a heavily-doped deep region of the second conductivity type extending to reach a more heavily-doped portion of said substrate.

The present invention also provides a SRAM-type memory cell, two first N-channel transistors of the cell having structures according to the preceding embodiment, and two second P-channel transistors of the cell being formed in an N-type well next to the area in which are formed the first transistors, the drain regions of the second transistors being formed close to said heavily-doped region of the first transistors.

The foregoing objects, features and advantages of the present invention, will be discussed in detail in the following non-limiting description of specific embodiments in connection with the accompanying drawings.

DETAILED DESCRIPTION

Figure 1:
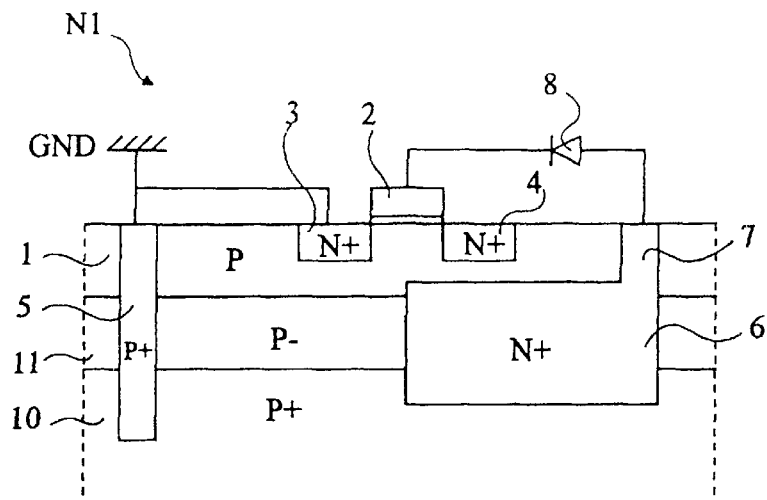
FIG. 1 illustrates, in a partial simplified cross-section view, a MOS transistor structure according to the present invention.
Figure 3:
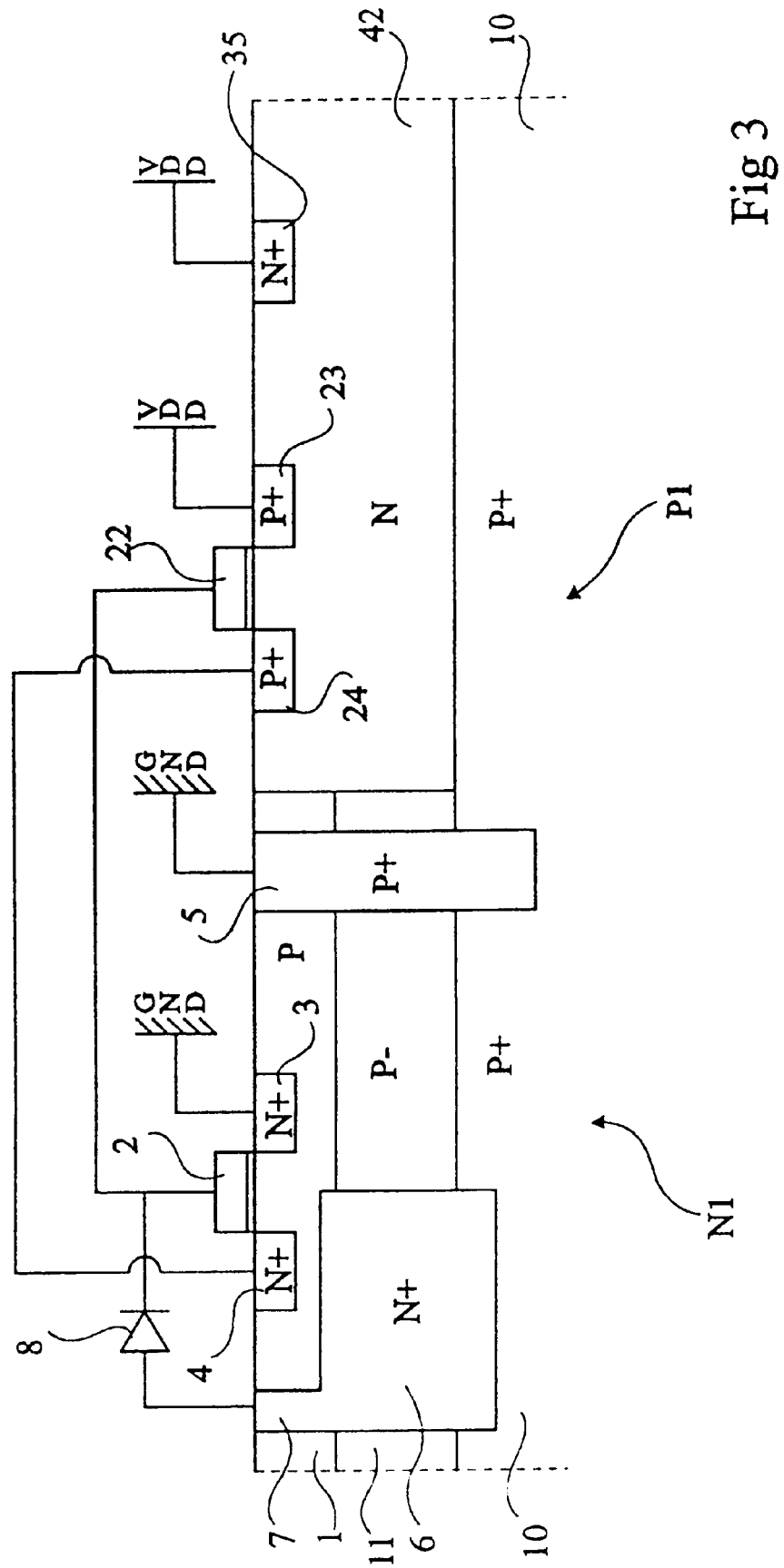
FIG. 3 illustrates an embodiment in a same substrate of two complementary MOS transistors according to the present invention.

For clarity, and as usual in the representation of integrated circuits, the cross-section views of FIGS. 1 and 3 are not drawn to scale. Further, same elements have been designated with same references in the drawings.

FIG. 1 illustrates, in a simplified partial cross-section view, an N-channel MOS transistor N1 formed according to the principles of the present invention.

Transistor N1 is formed in a surface area 1 of an epitaxial layer 11, itself formed on a single-crystal silicon wafer 10. Area 1, layer 11, and wafer 10 are P-type doped, wafer 10 being the most heavily doped and layer 11 the most lightly doped. An insulated gate 2, formed above area 1, defines a channel region. On either side of gate 2 are located heavily-doped N-type source and drain areas 3 and 4, formed in area 1. A heavily-doped P-type region 5 is used as a substrate contact. Contact region 5 and source 3 are connected to a same reference potential GND, for example, the system ground.

According to the present invention, the structure also includes a heavily-doped N-type buried layer 6. Layer 6 extends under the entire drain region 4 and under a portion of the channel area. However, layer 6 does not extend under the source region 3. Layer 6 and gate 2 are interconnected by means of a one-way conduction link. The link includes, for example, an N-type well 7 formed between layer 6 and the surface of area 1 and a PN-type diode 8 having its cathode connected to gate 2 and its anode connected to well 7. The diode 8 may advantageously be formed monolithically in any known manner.

The operation of transistor N1 is the following.

The case where gate 2 of transistor N1 is biased, like source 3, to reference potential GND of the circuit while drain 4 is connected to a high supply source Vdd is first considered. The transistor is then off and layer 6 does not affect this state.

Upon bombarding drain area 4 by ionizing particles, parasitic charges appear along their rectilinear trajectory in area 1 and in wafer 10 under drain 4. These parasitic charges are recovered by layer 6 instead of going to source 3. Diode 8 turns on and the parasitic charges are directed to gate 2 connected to low power supply GND.

In the case where gate 2 and drain 4 of transistor N1 are biased to high power supply Vdd, region 5 and source 3 being still biased to reference potential GND, transistor N1 is on. Due to the presence of diode 8, buried layer 6 does not affect the operation of transistor N1. Indeed, layer 6 is at the same ground potential GND, plus a junction voltage drop, as the surrounding epitaxial layer 11. To improve this biasing to the reference potential, for example, of null value, a deep conductive region 5 crossing region 1 and epitaxial layer 11 and reaching the more heavily-doped underlying silicon wafer 10 is provided.

The position of layer 6 will have to be chosen to avoid disturbing the equipotential distribution under the gate and around the drain-substrate junction. However, layer 6 must be sufficiently close to drain 4 for the charge created by the passing of an ionizing particle in the structure to be absorbed.

It should be noted that the doping of layer 6 must also be high, especially for layer 6 to be sufficiently conductive to rapidly transfer the parasitic charges to the ground.

The additional elements (buried layer 6, well 7, diode 8) to be introduced into a conventional structure to obtain a previously-described structure according to the present invention are advantageously simple and inexpensive to make and result in practically no increase of the component surface area.

Those skilled in the art will understand that the principles of the present invention previously described and illustrated applied to the forming of an N-channel MOS transistor in a technology on a P substrate also apply to a P-channel MOS transistor in a technology on an N substrate, provided to complementarily dope the different areas, regions, and layers, as well as the silicon wafer.

The present invention especially applies to the forming in a same substrate of complementary transistors, for example to form memory cells of SRAM type.

Figure 2:
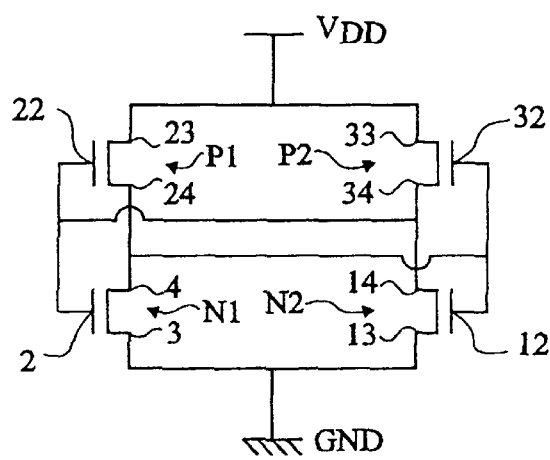
FIG. 2 is a partial circuit diagram illustrating an elementary SRAM cell.

FIG. 2 is an electric diagram of a SRAM-type memory cell. This cell includes four transistors, that is, two N-channel transistors N1 and N2 and two P-channel transistors P1 and P2. Transistors N1 and N2 are interconnected by their respective sources 3 and 13 to a same low power supply GND. Transistors P1 and P2 are interconnected by their respective sources 23 and 33 to a same high power supply Vdd. Transistors N1, N2, P1, P2 are connected in two complementary pairs N1-P1, and N2-P2 as follows. Drains 4–24, 14–34 and gates 2–22, 12–32 of the two transistors of a same pair N1-P1, N2-P2 are interconnected. The midpoint of the drain interconnections 4–24, 14–34 of a pair N1-P1, N2-P2 is connected to the common gate point 12–32, 2–22 of the other pair N2-P2, N1-P1.

The N-channel transistors of this cell, which are the most sensitive to ionizing particles, may advantageously be formed according to the present invention.

FIG. 3 illustrates an embodiment according to the present invention of two complementary transistors, corresponding to transistors N1 and P1 of FIG. 2 formed in a same semiconductive chip.

The left-hand portion of FIG. 3 shows transistor N1 of FIG. 1 formed in a surface area 1 of a P-type epitaxial layer 11 more lightly doped than underlying wafer 10. Area 1 is more heavily doped than layer 11. Transistor N1 includes, as previously, a gate 2, source and drain regions 3 and 4, a substrate contact region 5, a buried layer 6 and a one-way conduction link between layer 6 and gate 2. It is assumed, as previously, that source 3 and region 5 are biased to reference potential GND of the circuit.

The same wafer 10 also includes, to the right-hand of the drawing, a P-channel transistor P1. Said transistor is formed in an N-type well 42. Transistor P1 includes heavily-doped P-type regions, respectively forming its source 23 and its drain 24, formed at the surface of well 42 on either side of a channel area defined by an insulated gate 22. A heavily-doped N-type region 35 formed at the surface of well 42 ensures the substrate contact of transistor P1. Source 23 and region 35 are biased by high power supply Vdd.

Finally, FIG. 3 illustrates the connection of drain 4 and of gate 2 of transistor N1, respectively to drain 24 and to gate 22 of transistor P1, in accordance with the structure of FIG. 2. Such connections are formed by any usual method of forming such conductive connections.

It should be noted that, although N-type well 42 is shallow, due to the ground biasing of the underlying P regions (wafer 10) by deep regions 35, these underlying P regions perform for P-channel transistor P1 a function similar to that of region 6 for N-channel transistor N1. To improve the evacuation of parasitic charges by the portion of region P located under drain 24 of transistor P1, deep biasing region 5 will preferably be, as shown, close in top view to drain region 24.

Figure 4:
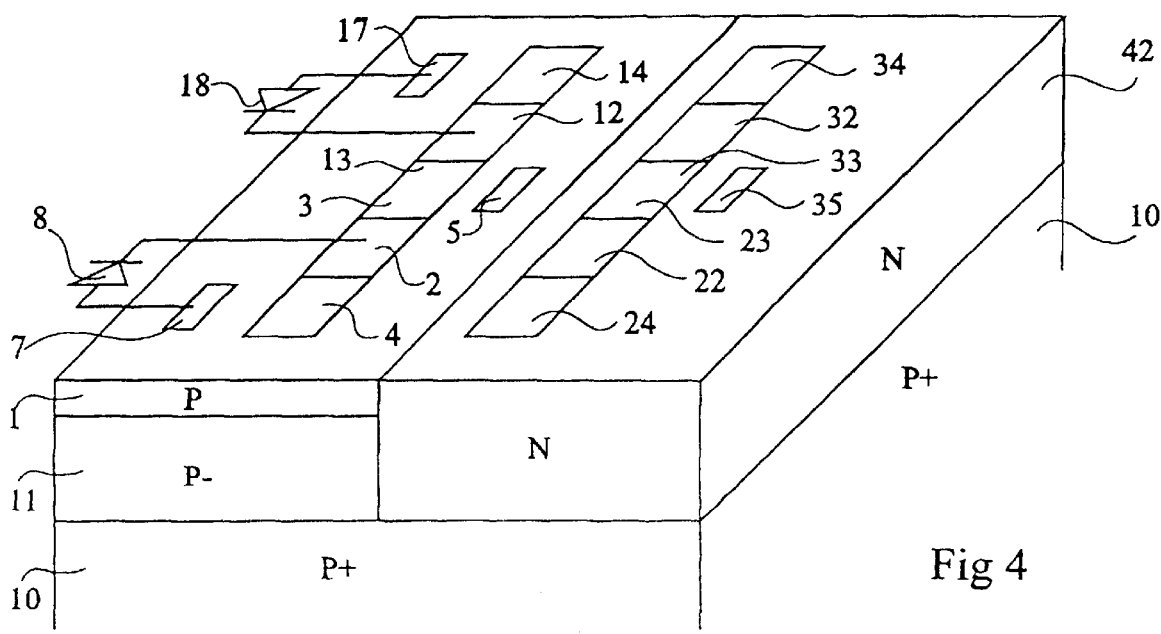
FIG. 4 is a perspective view in the cell of FIG. 2 formed according to an embodiment of the present invention.

FIG. 4 is a simplified perspective view of an embodiment of the SRAM cell of FIG. 2 in a heavily-doped P-type semiconductive wafer 10, according to the principles shown in FIG. 3. N-channel transistors N1, N2 are formed in an area 1 of a P-type doped epitaxial layer 11. P-channel transistors P1, P2 are formed in an N-type well 42 formed at the surface of wafer 10. The transistors of the same type are aligned, to have a common source region. In top view, a drain-gate-source-drain succession can thus be seen. A heavily-doped N-type buried layer (not shown) is located under each drain region 4, 14 of transistors N1, N2. Each buried layer is connected to gate 2, 12 of the transistor via a well 7, 17 and a diode 8, 18. The cathode of diode 8, 18 is connected to gate 2, 12, while its anode is connected to well 7, 17. Substrate contact regions 5 and 35 are also formed, respectively in area 1 and in well 42. Region 35 is a shallow surface region while region 5 crosses area 1 and layer 11 and reaches heavily-doped P-type wafer 10. Region 5 is preferably formed close to the limit between area 1 and well 42, to ensure the biasing of wafer 10 to the reference potential beyond drain regions 24–34 of transistors P1, P2, as previously discussed in relation with FIG. 3.

The previously-described memory cell (FIG. 2), formed according to the principles of the present invention discussed in relation with FIGS. 1 and 3, advantageously exhibits a robust hardening. Ionizing particles with a linear energy transfer of more than substantially 120 MeV.cm2/mg will indeed be necessary to cause untimely switchings of the cell, which is greater than current hardening standards.

This robust hardening is obtained at the cost of negligible performance and density reductions as compared to those of a memory according to prior techniques.

Indeed, the additional bulk introduced by the forming of the two buried layers, of the two wells 7, 17 and of the two diodes 8, 18 is smaller than that of redundancy solutions or of solutions with a cell having at least ten transistors. Further, as compared to these existing solutions, the additional junctions formed introduce negligible stray capacitances as compared to those due to the forming of additional gate structures.

As compared to a resistive decoupling solution, a structure according to the present invention is also advantageous. Indeed, as discussed in relation with FIG. 2, in the absence of disturbances, the transistor operation is not modified and no additional resistance is introduced. In the presence of ionizing particles bombarding a drain region of an N-channel transistor, the increased power consumption introduced by the resistance of layer 6 is negligible as compared to that caused by the high resistances necessary to the resistive decoupling.

Of course, the present invention is likely to have various alterations, modifications, and improvements which will readily occur to those skilled in the art. In particular, the principles of the present invention have been previously described and illustrated as applied to the forming of a memory cell of SRAM type in a P-type substrate. However, such a cell could be formed according to the same principles in an N-type substrate, provided to complementarily dope the different silicon wells, layers or regions. Further, those skilled in the art will understand that such a hardening method could be applied to the forming of other types of devices.

Similarly, although it has been chosen to ensure the biasing of the substrate and the source of a given transistor by a connection to a same high (Vdd) or low (GND) power supply, those skilled in the art will know how to bias them, if required, to different levels, for example in the case of high-frequency switches.

Those skilled in the art will also know how to adapt the described materials to a specific manufacturing line and select the doping levels of the various semiconductor layers according to the desired performances.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A lateral MOS transistor including a gate, drain and source regions of a first conductivity type formed in a substrate of a second conductivity type, the substrate connected to a first power supply, wherein a buried layer of the first conductivity type extends under the drain region, under only a portion of the gate and does not extend under the source region, the buried layer being connected to the gate via a one-way conduction means, and operative to conduct a current from the buried layer to the gate in a forward biased state.

2. The transistor of claim 1, wherein the one-way conduction means is a diode, a cathode of which is connected to the gate and an anode of which is connected to the buried layer.

3. The transistor of claim 1, wherein the connection of the substrate to the first power supply is ensured by a heavily-doped deep region of the second conductivity type joining a more heavily-doped portion of said substrate.

4. An SRAM-type memory cell, wherein two first N-channel transistors of the cell have structures according to claim 3, and wherein two second P-channel transistors of the cell are formed in an N-type well next to an area in which are formed the two first N-channel transistors, the heavily-doped region of the two first N-channel transistors being formed close to a limit between the N-type well and the area.

5. The transistor of claim 1, wherein the one-way conduction means is a operative to direct a parasitic current absorbed by the buried layer to ground.

6. The transistor of claim 1, wherein the buried layer is biased substantially to ground.

7. A MOS transistor comprising:
a gate;
a drain region and a source region, each of a first conductivity type formed in a substrate of a second conductivity type, the substrate connected to a first power supply;
a buried layer of the first conductivity type extending under the drain region, under a portion of the gate, and not extending under the source region; and
a one-way conduction means connected between the buried layer and the gate, and operative to conduct a current from the buried layer to the gate in a forward biased state.

8. The transistor of claim 7, wherein the one-way conduction means is a diode.

9. The transistor of claim 8, wherein a cathode of the diode is connected to the gate and an anode of the diode is connected to the burial layer.

10. The transistor of claim 7, wherein a connection of the substrate to the first power supply is ensured by a heavily-doped deep region of the second conductivity type joining a more heavily-doped portion of said substrate.

11. The transistor of claim 7, wherein the one-way conduction means is operative to direct a parasitic current absorbed by the buried layer to ground.

12. The transistor of claim 7, wherein the buried layer is biased substantially to ground.

13. A semiconductor structure formed on a substrate, comprising:
a first MOS transistor of a first type having a first gate, a first source and a first drain;
a second MOS transistor of a second type adjacent to the first MOS transistor;
a buried layer extending under the first drain, under a portion of the first gate, and not extending under the first source; and a one way conduction element connected between the buried layer and the first gate and operative to conduct a current from the buried layer to the first gate in a forward biased state.

14. The semiconductor structure of claim 13, wherein the first MOS transistor is formed in a first area, further comprising a first substrate contact formed in the first area.

15. The semiconductor structure of claim 14, wherein the first substrate contact is formed close to a second drain of the second MOS transistor.

16. The semiconductor structure of claim 13, wherein the second MOS transistor is formed in a second area, further comprising a second substrate contact formed in the second area.

17. The semiconductor structure of claim 13, wherein the one way conduction element is further coupled to a second gate of the second MOS transistor.

18. The semiconductor structure of claim 13, wherein the one way conduction element is a diode.

19. The semiconductor structure of claim 18, wherein an anode of the diode is coupled to the buried layer and a cathode of the diode is coupled to the first gate.

20. The semiconductor structure of claim 13, wherein the one way conduction element is operative to direct parasitic charges absorbed by the buried layer to ground.

21. The semiconductor structure of claim 13, wherein the first drain is coupled to a second drain of the second MOS transistor.

22. The semiconductor structure of claim 13, wherein the buried layer extends under the first drain and under only the portion of the first gate.

23. The semiconductor structure of claim 13, wherein the buried layer is biased substantially to ground.

24. The semiconductor structure of claim 13, wherein the substrate is of a first conductivity type, the first drain is of a second conductivity type, and the buried layer is of the second conductivity type.

25. The semiconductor structure of claim 13, wherein the first MOS transistor is formed in a surface area of an epitaxial layer formed on the substrate, and the second MOS transistor is formed in a well formed on the substrate.

26. The semiconductor structure of claim 25, wherein the substrate is of a first conductivity type, the epitaxial layer is of the first conductivity type, and the well is of a second conductivity type.

27. An SRAM cell formed on a substrate, comprising:
a first MOS transistor of a first type having a first gate, a first source, and a first drain;
a second MOS transistor of the first type having a second gate, a second source, and a second drain;
a third MOS transistor of a second type having a third gate, a third source, and a third drain;
a fourth MOS transistor of the second type having a fourth gate, a fourth source, and a fourth drain;
a first buried region extending under the first drain and under a portion of the first gate and not extending under the first source;
a second buried region extending under the second drain and under a portion of the second gate; and
a first switch coupled between the first buried region and the first gate, and operative to conduct a current from the first buried region to the first gate in a forward biased state;
wherein the first source is coupled to the second source;
the third source is coupled to the fourth source;
the first drain, third drain, second gate and fourth gate are coupled together; and
the second drain, fourth drain, first gate and third gate are coupled together.

28. The SRAM cell of claim 27, wherein the first MOS transistor and second MOS transistor are formed in a first area, and the third MOS transistor and fourth MOS transistor are formed in a second area.

29. The SRAM cell of claim 28, further comprising a first substrate contact formed in the first area.

30. The SRAM cell of claim 29; wherein the first substrate contact is formed close to a limit between the first area and the second area.

31. The SRAM cell of claim 28, further comprising a second substrate contact formed in the second area.

32. The SRAM cell of claim 27, wherein the first switch is a one-way conduction element.

33. The SRAM cell of claim 27, wherein the first switch is a diode.

34. The SRAM cell of claim 33, wherein an anode of the diode is coupled to the first buried region and a cathode of the diode is coupled to the first gate.

35. The SRAM cell of claim 27, wherein the first switch is operative to conduct a current from the first buried layer to the first gate.

36. The SRAM cell of claim 27, wherein the first switch is operative to direct parasitic charges absorbed by the first buried layer to ground.

37. The SRAM cell of claim 27, wherein the first buried layer is biased substantially to ground.

38. The SRAM cell of claim 27, wherein the substrate is of a first conductivity type, the first drain is of a second conductivity type, the first source is of a second conductivity type, the first buried region is of the second conductivity type, the third drain is of a first conductivity type, and the third source is of a first conductivity type.

39. The SRAM cell of claim 27, wherein the first MOS transistor and second MOS transistor are formed in a surface area of an epitaxial layer formed on the substrate, and the third MOS transistor and fourth MOS transistor are formed in a well formed on the substrate.

40. The semiconductor structure of claim 39, wherein the substrate is of a first conductivity type, the epitaxial layer is of the first conductivity type, and the well is of a second conductivity type.

* * * * *

UNITED STATES PATENT AND TRADEMARK OFFICE
CERTIFICATE OF CORRECTION

PATENT NO.     : 6,630,719 B2
DATED          : October 7, 2003
INVENTOR(S)    : Philippe Roche It is certified that error appears in the above-identified patent and that said Letters Patent is hereby corrected as shown below:

Column 1,
Line 2, the heading should read:
-- BACKGROUND OF THE INVENTION --

Column 6,
Line 47, Claim 9 should read:
9.     The transistor of claim 8, wherein a cathode of the diode is connected to the gate and an anode of the diode is connected to the buried layer.

Signed and Sealed this

Twentieth Day of January, 2004

JON W. DUDAS
*Acting Director of the United States Patent and Trademark Office*